United States Patent
Jiang

(10) Patent No.: US 11,830,705 B2
(45) Date of Patent: Nov. 28, 2023

(54) PLASMA FLOOD GUN FOR CHARGED PARTICLE APPARATUS

(71) Applicant: PIE Scientific LLC, San Mateo, CA (US)

(72) Inventor: Ximan Jiang, San Mateo, CA (US)

(*) Notice: Subject to any disclaimer, the term of this patent is extended or adjusted under 35 U.S.C. 154(b) by 347 days.

(21) Appl. No.: 17/222,431

(22) Filed: Apr. 5, 2021

(65) Prior Publication Data

US 2022/0059326 A1 Feb. 24, 2022

Related U.S. Application Data

(60) Provisional application No. 63/068,257, filed on Aug. 20, 2020.

(51) Int. Cl.
*H01J 37/32* (2006.01)
*H01J 37/317* (2006.01)

(52) U.S. Cl.
CPC .. *H01J 37/32706* (2013.01); *H01J 37/32357* (2013.01); *H01J 37/32871* (2013.01); *H01J 37/3174* (2013.01); *H01J 2237/153* (2013.01); *H01J 2237/184* (2013.01)

(58) Field of Classification Search
CPC ........... H01J 37/32706; H01J 37/32357; H01J 37/32871; H01J 37/3174; H01J 2237/153; H01J 2237/184; H01J 37/026; H01J 2237/0044; H01J 2237/0048
See application file for complete search history.

(56) References Cited

U.S. PATENT DOCUMENTS

| | | | | |
|---|---|---|---|---|
| 5,089,710 A | * | 2/1992 | Kikuchi | H01J 37/026 250/442.11 |
| 5,399,871 A | * | 3/1995 | Ito | H01J 37/026 250/251 |
| 5,903,009 A | * | 5/1999 | Bernstein | H01J 37/3171 250/251 |
| 6,100,536 A | * | 8/2000 | Ito | H01J 37/026 250/251 |
| 6,501,081 B1 | * | 12/2002 | Foad | H01J 37/026 250/251 |
| 6,828,571 B1 | * | 12/2004 | McCord | H01J 37/21 250/397 |
| 7,132,301 B1 | * | 11/2006 | Fan | H01J 37/28 250/306 |
| 7,253,410 B1 | * | 8/2007 | Bertsche | H01J 37/026 250/397 |
| 7,488,938 B1 | * | 2/2009 | Gubbens | H01J 37/28 250/311 |

(Continued)

FOREIGN PATENT DOCUMENTS

CA 1280223 C * 2/1991 ............ G21K 1/14
WO WO-2005115104 A2 * 12/2005 ............ C23C 14/48

*Primary Examiner* — Robert H Kim
*Assistant Examiner* — Christopher J Gassen
(74) *Attorney, Agent, or Firm* — Jigang Jin

(57) ABSTRACT

A method for altering surface charge on an insulating surface of a first sample includes generating first plasma inside a plasma source, causing the first plasma to diffuse into a first vacuum chamber to generate second downstream plasma, immersing the first sample in the second downstream plasma, and applying a first bias voltage to a conductive layer of the first sample, or applying a first bias voltage to a metal holder that holds the first sample.

36 Claims, 6 Drawing Sheets

(56) References Cited

U.S. PATENT DOCUMENTS

| | | | | |
|---|---|---|---|---|
| 7,573,051 B2* | 8/2009 | Goldberg | ............. | H01J 37/026 250/492.2 |
| 8,847,496 B2* | 9/2014 | Kurunczi | .......... | H01J 37/32688 315/111.21 |
| 2005/0201038 A1* | 9/2005 | Wang | ................. | H01L 21/3105 361/212 |
| 2008/0296496 A1* | 12/2008 | Zhao | .................... | G01N 23/225 250/306 |
| 2012/0187842 A1* | 7/2012 | DiVergilio | ............ | H01J 37/026 315/111.41 |
| 2016/0035537 A1* | 2/2016 | Erel | ..................... | H01J 37/026 250/307 |
| 2019/0043691 A1* | 2/2019 | Zhang | ................. | H01J 37/266 |

* cited by examiner

Step 1

Step 2

Step 3

Step 4

Step 5

PLASMA FLOOD GUN FOR CHARGED PARTICLE APPARATUS

CROSS-REFERENCE TO RELATED APPLICATION

This application claims priority to U.S. Provisional Patent Application 63/068,257, filed Aug. 20, 2020, the entire content of which is incorporated herein by reference.

FIELD OF INVENTION

This invention generally relates to surface charge control and specifically to surface charge control using downstream plasma at a charged particle system.

BACKGROUND OF THE INVENTION

Charged particles include electrons, positive ions, negative ions (, etc. Charged particle imaging apparatus are based on charged particles and can generate images with nanometer-scale resolution. Charged particle imaging apparatus include secondary electron microscope (SEM), electron beam inspection (EBI), electron beam review (EBR), electron beam metrology equipment (e.g., critical-dimension scanning electron microscope (CD-SEM)), electron beam lithography systems, X-ray photoelectron spectrometer (XPS), Auger electron spectrometer, low energy electron microscope (LEEM), photoemission electron microscope (PEEM), secondary ion mass spectrometer (SIMS), ion microscopes, and other imaging, surface analysis, and surface nano-machining equipment using charged particles.

Charged particle imaging apparatus have been widely used to image and analyze samples such as semiconductor devices (e.g., microstructures on silicon wafers), nanomaterials, polymers, or even biological tissues. In most charged particle imaging apparatus, incoming high energy particles (e.g., ions, electrons, or high energy X-ray photons) knock out secondary ions and electrons from a surface of a sample. The secondary ions and electrons are then collected by one or several charged particle detectors to form a high-resolution image of the surface. In some cases, incoming electrons reflected from a sample surface are collected to obtain the topographical and compositional information. However, if a sample surface consists of electrically insulating materials, there is no conductive path for the accumulated surface charge to dissipate. The incoming current from the charged particles may not equal the outgoing current of the secondary electrons and ions. As a result, the surface charge can accumulate on the insulating surface during an imaging process. The accumulated surface charge can change the surface potential and cause the focus of a charged particle beam to shift. The accumulated surface charge can also deflect a charged particle beam, causing beam position errors and creating image distortion.

Automated electron beam inspection, such as inspection by CD-SEM systems, are widely used in semiconductor production lines. The focus drift and image distortion caused by the accumulated surface charge present technical problems and challenges, especially when the feature size shrinks with Moore's Law. To improve the image quality, a charged particle imaging system may need to optimize the focus frequently. However, frequent image focus optimization increases the overall imaging time and reduces throughput. Image distortion can cause pattern registration errors during defect inspection and review. It can also cause measurement errors in metrology systems. In an electron beam lithography system, the surface charge can increase the size of an electron beam due to the focus drift induced by the variation of surface potential. The accumulated surface charge can also cause beam positional drift, pattern registration errors, and overlay errors.

In some cases, the accumulated surface charge is utilized to detect defects. For example, U.S. Pat. No. 7,132,301 discloses a voltage contrast review method to find incompletely etched vias on a semiconductor wafer. A wafer is flooded with electrons from an electron flood gun so that the wafer surface is negatively charged. The bottom of a completely etched via is an electrically conductive layer acting as an electrical ground, and the bottom of an incompletely etched via is a dielectric layer. Electrons can accumulate inside an incompletely etched via. Because the incompletely etched via is more negatively charged, it boosts the generation of secondary electrons. Thus, a defect (i.e., an incompletely etched via) will appear brighter on the image.

A surface charge can be conditioned or controlled by a flood of charged particles, including electrons and/or ions in charged particle imaging applications. For example, a dedicated flood gun can be installed at a location close to a primary charged particle column, such as the systems disclosed in U.S. Pat. No. 6,828,571 and U.S. Patent Application Publication No. 20160035537, 20080296496. In another example, U.S. Patent Application Publication No. 20050201038 discloses supplying an ionized gas to a surface of a structure and radiating the structure with ultraviolet light. A flood gun usually consists of a cathode with a heated filament as an electron source through the thermionic emission mechanism. The cathode is usually made of materials with low work functions. A downstream anode electrode has a relatively positive potential with respect to the cathode. The emitted electrons from the heated cathode are extracted, accelerated to relatively high energy, and directed to a sample placed underneath the flood gun. The cathode and the final flood beam are usually quite small, e.g., smaller than a couple of millimeters in one direction. In many cases, the landing spot of a flood beam and the imaging field of view of a primary column don't overlap. A sample has to be moved between a landing spot of the flood gun and an imaging field of view of the primary column by an X-Y stage. In some applications, the whole surface of a sample, such as a 12" silicon wafer, needs to be pre-charged to a specific potential. As the sample needs to be scanned under the flood gun to cover the whole surface, the pre-charging process can take a long time.

In order to inspect as many samples as possible, a charged particle imaging system usually only images one or several small areas of a sample surface. The time it takes to pre-charge the entire sample surface using a traditional flood gun is often too long compared with the image collection time. To address the throughput issue with a conventional flood gun, pre-scanning methods using a primary imaging electron beam have been proposed, such as the systems disclosed in U.S. Pat. Nos. 7,253,410 and 7,488,938 and U.S. Patent Application Publication No. 20190043691. The methods usually pre-scan an area that will be imaged subsequently after an X-Y stage moves a sample to a test location. The charge control pre-scan can use the same or a larger beam current. The field of view of the charge control pre-scan can be the same or larger than the final imaging field of view. The charge control pre-scan can also be interlaced with an imaging scan. The imaging data collected from the charge control pre-scan is usually discarded. Only the data from the final imaging scan is used to construct images of a sample. However, adding charge control scanning frames increases the overall imaging time and reduces the throughput.

In above conventional surface pre-charge methods, the overall throughput is affected by a) a low electron emission current from a thermionic emission filament inside a flood gun or a primary electron imaging column; b) the need to reposition a sample when a separate flood gun is used and the need to scan a sample under the flood gun; c) the time to scan charge control frames; and d) the time to switch between imaging optics conditions and sample flooding conditions, including sample stage voltages. Hence, an improved pre-charge method is desirable for increasing the throughput and utilization rate of a charged particle imaging equipment.

Surface charge control is not only crucial for charged particle imaging equipment, but also for ion implantation equipment. During ion implantation, the surface of a wafer is usually positively charged by incoming positive ions. If the positive charge is not neutralized, it can continue to accumulate, and eventually generate an arc through a sensitive insulating layer of an integrated circuit device. The surface charge can also deflect incoming ions, and change the landing energy of the ions. Unlike the charged particle imaging systems, some ion implanters utilize a plasma flood gun to provide low energy electrons to neutralize the surface charge of a sample, such as the systems disclosed in PCT Patent Application No. WO2015061578, U.S. Pat. Nos. 5,399,871 and 8,847,496, and U.S. Patent Application Publication No. 20120187842. A plasma flood gun is usually installed along the path of an incoming ion beam and close to the final target. An opening between the plasma flood gun and a main ion beam chamber for the primary ion beam allows low energy electrons from the plasma flood gun to enter the main ion beam chamber. A negatively biased electrode inside the plasma flood gun pushes the low energy electrons out of the plasma flood gun and into the main ion beam chamber through the opening.

SUMMARY OF THE INVENTION

The present invention discloses methods and systems of surface charge control at a charged particle apparatus. In one embodiment, a method for altering surface charge on an insulating surface of a sample includes placing a first sample having an insulating surface area inside a first vacuum chamber that is connected to an external plasma source through a first opening; generating first plasma inside the external plasma source; causing the first plasma to diffuse into the first vacuum chamber to generate second downstream plasma: positioning the first sample to a location such that the first sample is immersed in the second downstream plasma; applying a first bias voltage to a conductive layer of the first sample, or applying a first bias voltage to a holder that holds the first sample; after the second downstream plasma is generated and the first bias voltage is applied, waiting for a predetermined amount of time such that the surface potential of the insulating surface area reaches a predetermined value; turning off the first plasma and waiting for the second downstream plasma to disappear; and after the second downstream plasma is extinguished, changing the first bias voltage or reducing the first bias voltage to zero.

In another aspect, a method of altering surface charge on an insulating surface includes placing a first sample having an insulating surface area inside a first vacuum chamber; generating first plasma inside the first vacuum chamber; positioning the first sample to a location such that the first sample is immersed in the first plasma; applying a first bias voltage to a conductive layer of the first sample, or applying a first bias voltage to a holder that holds the first sample; after the first plasma is generated and the first bias voltage is applied, waiting for a predetermined amount of time such that a surface potential in the insulating surface area reaches a predetermined value; turning off the first plasma; and after the first plasma disappears, changing the first bias voltage or reducing the first bias voltage to zero.

In another aspect, a method of altering surface charge on an insulating surface includes placing a first sample having an insulating surface area inside a first vacuum chamber that is connected to a plasma source through a first opening; generating first plasma inside the plasma source; applying a first bias voltage to the plasma source to extract a first charged particle beam from the plasma source through the first opening; positioning the first sample to a location such that a portion of the insulating surface area of the first sample is illuminated by the first charged particle beam; applying a second bias voltage to a conductive layer of the first sample, or applying a second bias voltage to a metal holder that holds the first sample; scanning the first sample in an X-Y plane such that all the portions of the insulating surface area that needs to be flooded are illuminated by the first charged particle beam; turning off the first plasma; turning off the first bias voltage; and changing the second bias voltage to zero or a value different from the second bias voltage after the first charged particle beam is turned off.

The methods illustrated in the present invention utilize plasma or downstream plasma from a plasma flood gun to control surface charge of a sample. As far as we know, there is no method of using plasma or downstream plasma to control surface charge in charged particle imaging equipment, charged particle inspection equipment, charged particle lithography equipment, and ion implantation equipment. The techniques disclosed in the present invention may improve the speed of surface charge control compared with the traditional methods. In some embodiments of the present invention, a whole sample surface, such as a whole surface of a silicon wafer, is immersed in plasma or downstream plasma. Further, the methods disclosed in the present invention include not only charge neutralization but also intentionally creating positive or negative surface charge by biasing a sample to a certain potential. The charge control methods disclosed in the present invention apply to charged particle imaging and lithography equipment, charged particle inspection equipment, and ion implantation equipment.

BRIEF DESCRIPTION OF THE DRAWINGS

The subject matter, which is regarded as the invention, is particularly pointed out and distinctly claimed in the claims at the conclusion of the specification. The foregoing and other features and also the advantages of the invention will be apparent from the following detailed description taken in conjunction with the accompanying drawings.

DETAILED DESCRIPTION

Detailed description of the present invention is provided below along with figures and embodiments, which further clarifies the objectives, technical solutions, and advantages of the present invention. It is noted that schematic embodiments discussed herein are merely for illustrating the invention. The present invention is not limited to the embodiments disclosed.

The present invention uses a plasma source to generate downstream plasma or a flood beam to control the potential of an insulating surface of a sample in a charged particle imaging or lithography system. The present invention may improve the speed of surface pre-charging before an imaging process and the speed of charge neutralization after an imaging process.

Figure 1:
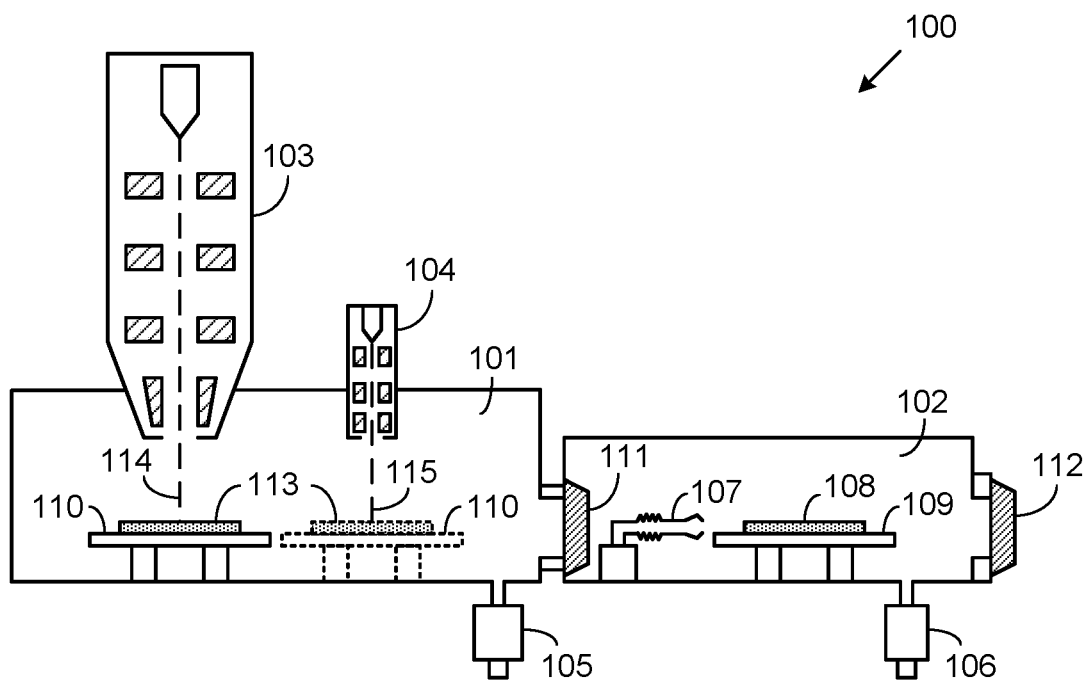
FIG. 1 is a diagram illustrating a prior-art charged particle imaging system with a thermionic emission flood gun.

FIG. 1 shows a view of a prior-art charged particle imaging system 100. The system 100 includes a main chamber 101 and a separate load lock chamber 102. A charged particle column 103 is connected to the main chamber 101 for imaging a sample. An electron flood gun 104 is connected to the main chamber 101 for surface charge control of the sample. The load lock chamber 102 is arranged for fast sample exchange without breaking the vacuum level in the main chamber 101. In some cases, certain charged particle imaging systems do not have a load lock chamber such as the load lock chamber 102.

The main chamber 101 is pumped by a vacuum pump system 105. The load lock chamber 102 is pumped by a vacuum pump system 106. The load lock chamber 102 has a robotic arm 107 that can hold and transfer a sample 108. The robotic arm 107 has a mechanical mechanism and can transfer the sample 108 between a stage 109 in the load lock chamber 102 and a stage 110 in the main chamber 101. A gate valve 111 separates the main chamber 101 and the load lock chamber 102. A gate valve 112 isolates the load lock chamber 102 from an external atmospheric environment. When the charged particle column 103 images a sample 113 on the stage 110, the load lock chamber 102 can prepares the sample 108 and make it ready to be imaged. After an imaging process on samples 113 is completed, the sample 113 can be quickly replaced by the sample 108 in the load lock chamber 102. One of the main purposes of the load lock chamber 102 is to reduce the exchange time when samples are moved between a vacuum environment in the main chamber 101 and an external environment at the atmospheric pressure.

As shown in FIG. 1, the charged particle column 103 generates a charged particle beam 114 for imaging the sample 113, and the electron flood gun 104 emits an electron flood beam 115 for altering or modifying the surface potential of the sample. The term "potential" as used herein indicates electric potential. The electron flood gun 104 uses the traditional thermionic emission that relies on heating up a filament to emit low energy electrons. The electrons are then accelerated by an anode inside. The electrons eventually reach the sample 113 placed below the electron flood gun 104. Before the electron flooding process, the stage 110 is moved from an imaging position to an electron flooding position (e.g., as shown in dotted lines of FIG. 1), if the axis of the electron flood gun 104 doesn't overlap the axis of the charged particle column 103. At the electron flooding position, the sample 113 is below and aligned with the electron flood gun 104. Due to the small size of the filament, the spot of the electron beam is usually around a couple of millimeters or smaller than that, significantly smaller than the size of a sample, such as a 300 mm (12") wafer. As a consequence, the stage 110 needs to move in a horizontal plane such that the electron flood beam can scan all necessary areas on the sample 113. The scanning process is often time consuming and thus undesirable.

Compared to an electron beam, downstream plasma generated by a plasma source may be much larger. When the size of a flooding spot is increased, the speed of a surface pre-charging process may be increased. For example, a plasma chamber may generate plasma. When the plasma diffuses into an imaging chamber to form downstream plasma, the whole top surface of a sample may be immersed in the downstream plasma. Plasma is an ionized gas that consists of positive ions, electrons, neutral atoms or molecules and roughly maintains charge neutrality. In a plasma chamber, free-moving electrons may be accelerated by an external electric field to acquire enough energy to ionize neutral atoms or molecules along paths they travel.

Figure 2:
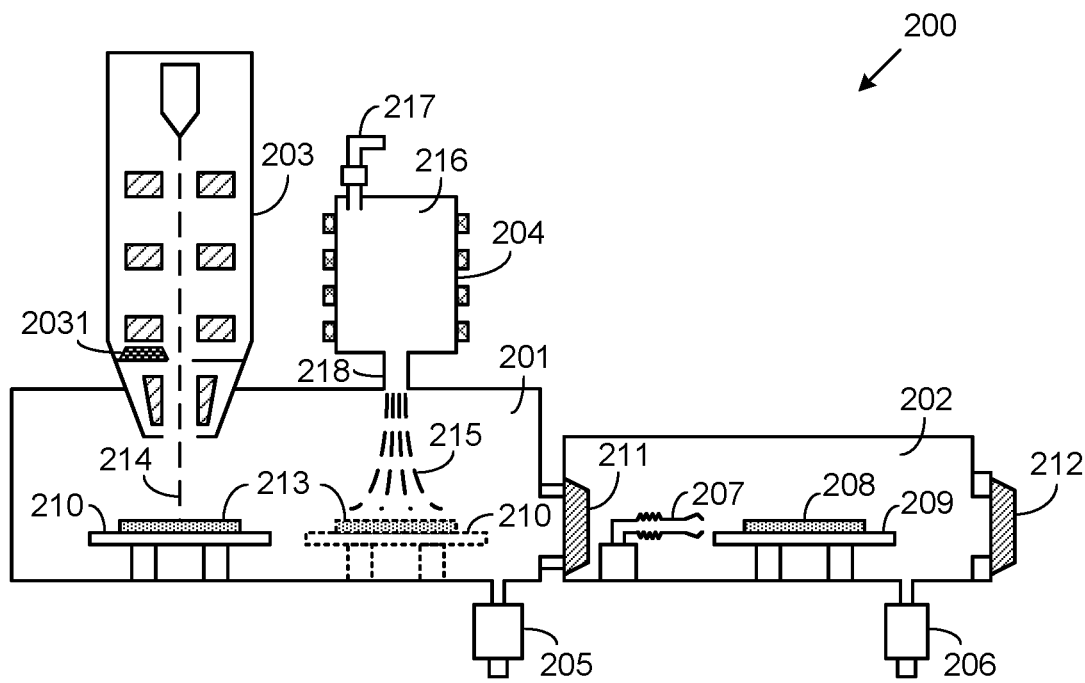
FIG. 2 illustrates a schematic view of a charged particle imaging system with a plasma flood gun producing downstream plasma, according to embodiments of the present invention.

FIG. 2 schematically illustrates a charged particle imaging system 200 according to embodiments of the present invention. The charged particle imaging system 200 may also be used for lithography and thus may also be used as a charged particle lithography system for exposing the resist layer on a sample. In a lithography system, for example, an electron beam may be used to pattern a photoresist layer that is coated on a surface of a substrate (e.g., a wafer). In descriptions below, embodiments of charged particle lithography systems for exposing a sample are illustrated. The embodiments of the charged particle imaging systems described below apply to charged particle lithography systems for lithographing a sample, since they share the same or similar principles and structures. The imaging process in charged particle lithography system can also be described as resist exposure process.

The system 200 may include a main chamber 201 and a separate load lock chamber 202. The main chamber 201 may also be referred to as a main process chamber or a main process vacuum chamber. A charged particle column 203 may be connected to the main chamber 201 for exposing a sample. Optionally, multiple charged particle columns (not shown) may be connected to the main chamber 201 for exposing a sample. In addition, multiple samples may be placed inside the main chamber 201 for lithography applications. A plasma flood gun 204 may be connected to the main chamber 201 for surface potential control of the sample in a plasma flooding surface charge control process. The plasma flood gun 204 works as an external plasma source for the main chamber 201. Alternatively, multiple plasma flood guns (not shown) may be connected to the main chamber 201 for surface potential control of a sample in plasma flooding surface charge control processes. Similar to the load lock chamber 102 of FIG. 1, the load lock chamber 202 is arranged for fast sample exchange without breaking the vacuum level in the main chamber 201. Further, the charged particle column 203 may include a gun gate valve 2031 for isolating a charged particle source of the charged particle column 203 from the main chamber 201. When the main chamber is not at a preset vacuum condition, the gun gate valve 2031 is closed. Thus, the vacuum state of the charged particle column 203 is not affected by conditions in the main chamber 201. The gun gate valve 2031 also prevents potential contamination from happening in the charged particle column 203 when the main chamber 201 is not vacuum, e.g., containing the air or certain gases. In some embodiments, additional plasma flood guns may be installed on the main chamber 201 and/or the load lock chamber 202 to increase the speed of a charged particle flooding process. Optionally, the charged particle imaging system 200 may include the main chamber 201 but not include the load lock chamber 202. In such a case, a sample may be transferred from the outside to the main chamber 201 at the external atmospheric environment (i.e., at atmospheric pressure). When a sample is transferred in and out of the main chamber 201 at the external atmospheric environment, the gun gate valve 2031 should be closed for keeping the vacuum and preventing contamination in the charged particle column 203.

The main chamber 201 may be pumped by a vacuum pump system 205. The load lock chamber 202 may be pumped by a vacuum pump system 206. The vacuum pump systems 205 and 206 may be, for example, turbopump systems. The load lock chamber 202 may have an electromechanical robotic arm 207. The robotic arm 207 may hold a sample 208 (e.g., a 12" silicon wafer) and transfer the sample 208 between a stage 209 in the load lock chamber 202 and a stage 210 in the main chamber 201. The stages 209 and 210 may serve as a supporter or holder that supports and holds the sample 208. A gate valve 211 may be installed between the main chamber 201 and the load lock chamber 202 to connect the two chambers. When the gate valve 211 is open, the main chamber 201 and the load lock chamber 202 are at the same pressure. When the gate valve 211 is closed, the main chamber 201 and the load lock chamber 202 are separated and may have different conditions. The load lock chamber 202 may have a gate valve 212 that either connects it to or isolates it from the external atmospheric environment. When the charged particle column 203 is in a process to image a sample 213 on the stage 210, the load lock chamber 202 may take the sample 208 and make it ready to enter the main chamber 201. After an imaging or lithography process on the sample 213 is completed, the sample 213 may be quickly replaced by the sample 208 in the load lock chamber 202.

Further, the charged particle column 203 may generate a charged particle beam 214 for imaging the sample 213 at an imaging time, and the plasma flood gun 204 may produce downstream plasma 215 for changing the surface potential of the sample at a processing time. The surface potential may be defined with respect to the sample or the stage 209 or 210. Since the imaging process and the surface charge control process are performed in the same chamber (i.e., the main chamber 201), they are conducted separately. That is, the imaging time and processing time do not overlap for protecting the charged particle column 203. The plasma flood gun 204 may include a plasma chamber 216 made of conductive and insulating materials, a gas input port 217 that regulates the flow rate of a process gas, and an energy source (not shown). The energy source may couple the energy into the plasma chamber 216, and supply a DC or AC current, a DC or AC voltage, and electromagnetic waves with frequency from KHz to GHz. The coupling method may include an inductively coupling method, a capacitively coupling method, a dc glow discharge coupling method, a microwave discharge coupling method, or an electron cyclotron resonance (ECR) discharge coupling method. The plasma flood gun 204 may include different plasma sources such as an inductively coupled plasma source with one or more turns of coils placed outside a dielectric chamber wall or inside the plasma chamber 216, a capacitively coupled plasma source with one or more electrodes placed inside or outside the plasma chamber 216, a microwave plasma source with a waveguide and dielectric windows to couple the energy into the plasma chamber 216, etc. The plasma flood gun 204 may inject the downstream plasma 215 to the main chamber 201 through an opening and a conduit 218 connected to the opening. That is, the plasma flood gun 204 and the main chamber 201 may be connected by the opening and the conduit 218. The conduit 218 may be installed on the main chamber 201 and supported by a flange (not shown) mounted on an outer wall of the main chamber 201.

Optionally, the plasma chamber 216 may be connected to the main chamber 201 through an opening but without a conduit (e.g., the conduit 218). In some embodiments, the plasma chamber 216 may be installed inside the main chamber 201. Optionally, multiple openings (not shown) and/or multiple conduits (not shown) may be configured between the plasma chamber 216 and the main chamber 201. In some cases, the openings may be circles, squares, rectangles, or long slits. The size and quantity of the openings and conduits may be arranged to create certain pressure difference between the plasma chamber 216 and the main chamber 201. For example, the opening may include one or more differential pumping apertures between the plasma chamber 216 and the main chamber 201. The differential pumping aperture may reduce the size of the opening. When a differential pumping aperture is installed, the pressure inside the plasma chamber 216 may be maintained higher than the pressure inside the main chamber 201. In some cases, the pressure in the plasma chamber 216 may be much higher than that in the main chamber 201. For example, the pressure in the plasma chamber 216 may be higher than 50 mTorr, while the pressure in the main chamber 201 may be lower than 0.5 mTorr when the vacuum pump system 205 pumps the main chamber 201. Higher pressure in the plasma chamber 216 may increase the efficiency of the plasma discharge, and make the plasma ignition process more reliable. Lower pressure in the main chamber 201 may reduce the load of the vacuum pump system 205. Thus, the differential pumping aperture may reduce the size of the opening, make the pressure inside the plasma chamber 216 higher than that inside the main chamber 201, improve the plasma discharge efficiency, and make a plasma ignition process reliable.

Under certain operating conditions, the plasma may leak out of the plasma chamber 216 and diffuse into the main chamber 201. The plasma generated in the plasma chamber 216 may absorb the energy from the energy source, transfer the energy into the main chamber 201, and sustain the downstream plasma 215.

In some embodiments as shown in FIG. 2, the plasma flood gun 204 may be integrated with the main chamber 201. The stage 210 may move the sample 213 from a location under the charged particle column 203 to a location under the plasma flood gun 216, as shown in dotted lines in FIG. 2. The whole top surface of the sample 213 may be immersed in the downstream plasma 215. Since the plasma contains positive ions and electrons, it may alter or change the surface charge and the surface potential of the sample 213. Further, a bias voltage may be applied to the sample 213. When the back of the sample 213 is electrically conductive, the bias voltage may be applied to the back of the sample 213. Optionally, when a layer of the sample 213 is electrically conductive, the bias voltage may be applied to the conductive layer of the sample 213. Alternatively, the bias voltage may be applied to the stage 210 or the stage 210 and the sample 213 at the same time, when the stage 210 is electrically conductive (e.g., the stage 210 may be a metal stage made of a metal). The surface charge and/or the surface potential of the sample 213 may be adjusted for improving the performance of the charged particle imaging system 200, such as improving the image focus stability, improving the image distortion, improving the beam position drift, improving the image voltage contrast, improving the signal to noise ratio, and/or neutralizing charge (or existing charge) accumulated in the insulating surface area of or inside the sample 213.

In some embodiments, the plasma flood gun 204 and the charged particle column 203 may be placed within a sufficiently short distance such that the paths of the downstream plasma 215 and the charged particle beam 214 overlap each other. As such, the stage 210 does not need to move and the sample 213 may remain at the same location for imaging and pre-charging processes.

Figure 3:
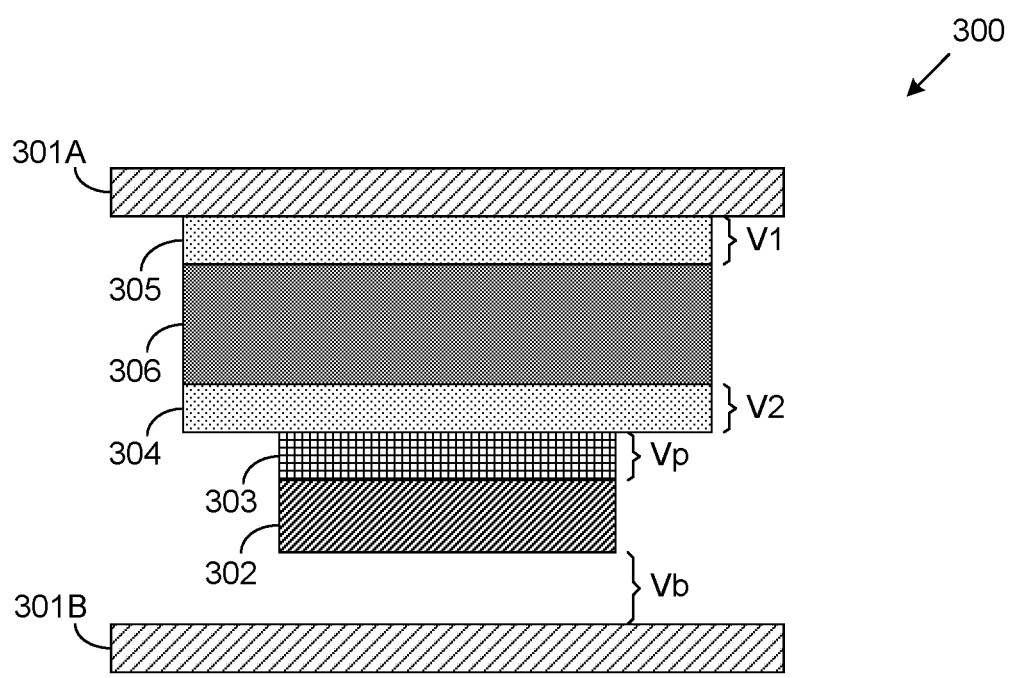
FIG. 3 illustrates schematically a sample immersed in the plasma, according to embodiments of the present invention.

FIG. 3 illustrates a schematic setup 300 where a sample is immersed in the plasma. The setup 300 may be used to describe a mechanism of altering the surface potential of a sample in a plasma environment. A plasma chamber (not shown) may include a top chamber wall 301A and a bottom chamber wall 301B. Both the top and bottom chamber walls 301A and 301B are at the ground potential. The sample may have a bottom conductive or semiconductive layer 302 and a top insulating layer 303 that includes an insulating surface area. The plasma, such as the downstream plasma 215 shown in FIG. 2, may include a plasma sheath 304, a plasma sheath 305, and bulk plasma 306. The plasma sheath 304 is between the top surface of the insulating layer 303 of the sample and the bulk plasma 306. The plasma sheath 305 is between the top chamber wall 301A and the bulk plasma 306. The bulk plasma 306 may remain charge-neutral with an equal amount of positively charged ions and negatively charged electrons. The charge-neutral bulk plasma 306 may also contain some negatively charged ions in some cases. The potential across the bulk plasma 306 may be the same approximately. The plasma sheath 304 and plasma sheath 305 may have more positively charged ions than the negatively charged electrons, which may push the potential of the bulk plasma 306 slightly positive with respect to the ground. The width of the sheath 304 may widen or shrink with the bias voltage (Vb) applied to the bottom conductive layer 302 of the sample. The voltage drop across the plasma sheath 305 is V1. The voltage drop across the plasma sheath 304 is V2. The voltage drop across the top insulating layer 303 is Vp. The potential on the bottom conductive layer 302 is the same across the whole layer. As such, the potential of the bulk plasma 306 may equal V1 if it is calculated from the top chamber wall 301A. From the bottom chamber wall 301B, the potential of the bulk plasma may equal Vb+Vp+V2. As V1=Vb+Vp+V2, it's concluded that Vp=V1−V2−Vb. V1 and V2 usually have relatively very small values. Thus Vp may become negative with a positive Vb bias voltage applied to the bottom conductive layer 302. For example, a positive bias Vb may flood the top surface of the top insulating layer 303 negatively with respect to the bottom conductive layer 302 when the sample is immersed in the plasma. By adjusting the bias voltage Vb applied to the bottom conductive layer 302 of the sample, positive, negative, or zero (neutral) surface charge may be generated on the top surface of the top insulating layer 303.

After the bias voltage Vb is applied, it may attract ions or electrons to the top surface of the top insulating layer 303. To reduce the landing energy of the ions or electrons from the bulk plasma 306 and the plasma sheath 304, the bias voltage Vb may be ramped slowly (e.g., at a predetermined speed) instead of rapidly for minimizing sudden inrush of high energy electrons or ions onto the top insulating layer 303. Slow ramping of the bias voltage Vb may also keep the width of the plasma sheath 304 stable and reduce the potential V2 across the plasma sheath 304. In some cases, the plasma is extinguished before lowering the bias voltage Vb to zero. If the plasma is not extinguished before lowering the bias voltage Vb to zero, the surface charge on the top insulating layer 303 may be altered by the plasma while the bias voltage Vb is ramped down.

As shown in FIG. 3, when the whole sample is immersed in the plasma, the whole top surface of the top insulating layer 303 may be flooded uniformly in one shot. As long as the value of V1−V2 remains relatively low, the variation of the surface potential across the surface of the top insulating layer 303 may be small. The electron current delivered by a traditional thermionic flood gun is usually on the order of microamperes to milliamperes. The electron current from a charged particle column (e.g., the charged particle columns 103 and 203 with respect to FIGS. 1 and 2) is usually on the order of picoamperes to nanoamperes. In comparison, a plasma source such as the plasma chamber 204 of FIG. 2 may generate more than one ampere of flooding electron current, several orders of magnitude higher than that from the traditional methods. In addition, the size of the single-shot flooding area is orders of magnitude larger than that from the traditional methods. One advantage of the traditional thermionic flood gun and flooding frame method is that it can work under a high vacuum condition. Then, there is no need to isolate a charged particle source from a main chamber (e.g., turning off the gun gate valve 2031 of FIG. 2) during a traditional surface charge flooding process. With the plasma chamber 204 installed on the main chamber 201, the gun gate valve 2031 may need to be closed to prevent the process gas from reaching the charged particle source of the charged particle column 203, which needs to be maintained at an ultra-high vacuum level. Alternatively, a differential pumping aperture may be configured inside the charged particle column 203 to prevent the process gas from reaching the charged particle source.

Figure 4:
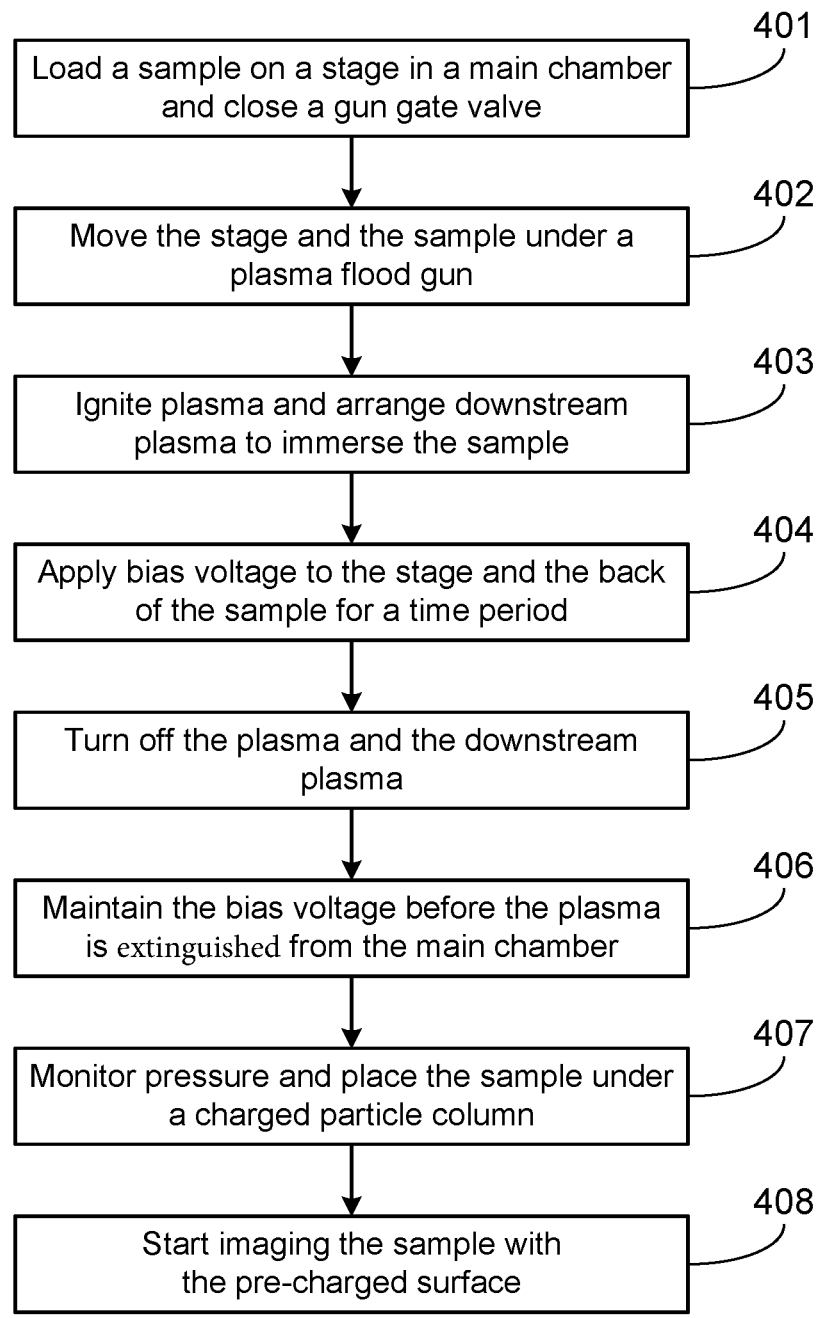
FIG. 4 illustrates a schematic flow chart of using downstream plasma to pre-charge a surface of a sample, according to embodiments of the present invention.

FIG. 4 shows a schematic flow chart 400 for using downstream plasma in a charged particle imaging equipment according to embodiments of the present invention. At step 401, a sample is loaded in a main chamber and onto a stage. The main chamber has a charged particle column for charged particle imaging applications and a plasma flood gun for generating downstream plasma. The charged particle column includes a gun gate valve to protect its charged particle source and prevent the charged particle source from being contaminated by some material or elements in the main chamber. The gun gate valve may be closed before the sample is placed on the stage and made ready for imaging and open only during an imaging process. At step 402, the stage and the sample are moved under the plasma flood gun. At step 403, the gas flow is started to bring in the process gas, and the plasma flood gun is turned on to ignite plasma inside the plasma flood gun. Downstream plasma is generated by diffusing a portion of the plasma into the main chamber. The downstream plasma immerses the top surface of the sample. At step 404, a bias voltage is applied to the back of the sample and the stage via a wiring arrangement installed in the main chamber. The downstream plasma immerses the sample and the bias voltage is applied to the sample for a period of time such that the surface charge on the sample becomes saturated. That is, the bias voltage is applied to the plasma-immersed sample until the surface charge on the sample gets saturated. In some embodiments, the sample surface may be pre-charged to a certain potential before an imaging process begins. In some other cases, the surface charge of the sample may be neutralized. Further, the charge inside the sample, e.g., the charge trapped in a top insulating layer (or insulating surface area) of the sample, may also be neutralized. At step 405, the plasma inside the plasma flood gun is turned off. Thus, the downstream plasma is off as well. At step 406, the bias voltage applied on the sample is maintained before the plasma is extinguished from the main chamber. After the plasma disappeared in the main chamber, the bias voltage applied on the sample is turned off. At step 407, the pressure in the main chamber is monitored and pumping is conducted to make the pressure in the main chamber reach a value suitable for imaging operations. Further, the sample is moved to a position under the charged particle column. The gun gate valve is opened after the residual gas is pumped out of the main chamber and the pressure in the main chamber is below the predetermined value. At step 408, an imaging process begins and the sample with the pre-charged (or neutralized) surface is imaged by the charged particle column.

As the downstream plasma may be large enough to cover the whole top surface of a sample, scanning of the sample surface may no longer be required. Further, the plasma flood gun may be arranged such that the downstream plasma may reach the sample when the sample is under the charged particle column. In such a case, the sample may stay at a place after being loaded into the main chamber, and there is no need to move the sample to separate locations for pre-charging and imaging processes.

Besides a charged particle imaging process, the method with respect to steps 401-408 of FIG. 4 also applies to a charged particle lithography process, a charged particle inspection process, a charged particle processing application (e.g., an ion implantation process), and other charged particle processes.

Figure 5:
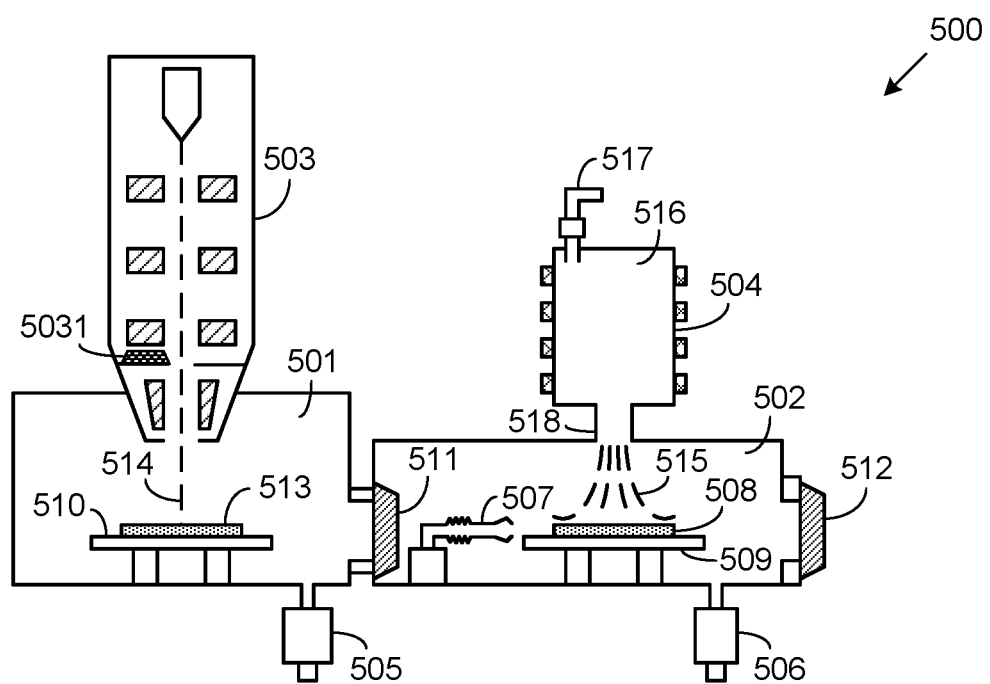
FIG. 5 illustrates a schematic view of a charged particle imaging system with a plasma flood gun producing downstream plasma, according to embodiments of the present invention.

FIG. 5 schematically illustrates a charged particle imaging system 500 according to embodiments of the present invention. Similar to the system 200, the charged particle imaging system 500 may also be used for lithography and thus may be a lithography system as well. The system 500 may include a main chamber 501 and a separate load lock chamber 502. A charged particle column 503 may be connected to the main chamber 501 for imaging a sample. A plasma flood gun 504 may be connected to the load lock chamber 502 for surface potential control of a sample. Similar to the load lock chamber 202 of FIG. 2, the load lock chamber 502 is arranged for fast sample exchange without breaking the vacuum level in the main chamber 501. Further, the charged particle column 503 may include a gun gate valve 5031 for isolating a charged particle source of the charged particle column 503 from the main chamber 501. When the gun gate valve 5031 is closed, the vacuum state of the charged particle column 503 is not affected by conditions in the main chamber 501. The gun gate valve 5031 also prevents potential contamination from happening in the charged particle column 503 when the main chamber 501 is not vacuum. In some embodiments, additional plasma flood guns may be installed on the load lock chamber 502 to increase the speed of the charged particle flooding process.

The main chamber 501 may be pumped by a vacuum pump system 505. The load lock chamber 502 may be pumped by a vacuum pump system 506. The vacuum pump systems 505 and 506 may be, for example, turbopump systems. The load lock chamber 502 may have a robotic arm 507 that may load a sample 508 (e.g., a 12" silicon wafer) onto a stage 509 and transfer the sample 508 between the stage 509 and a stage 510 in the main chamber 501. A gate valve 511 may be installed to connect the main chamber 501 and the load lock chamber 502. When the gate valve 511 is open, the main chamber 501 and the load lock chamber 502 are at the same pressure. When the gate valve 511 is closed, the main chamber 501 and the load lock chamber 502 are separated and may have different conditions. The load lock chamber 502 may have a gate valve 512 that connects it with and isolates it from the external atmospheric environment. When the charged particle column 503 is in a process to image a sample 513 on the stage 510, the load lock chamber 502 may pre-charge the sample 508 and make it ready to be imaged. After an imaging or lithography process on the sample 513 is completed, the sample 513 may be quickly replaced by the sample 508 in the load lock chamber 502.

As shown in FIG. 5, the charged particle column 503 may generate a charged particle beam 514 for imaging the sample 513 in the main chamber 501, and the plasma flood gun 504 may generate downstream plasma 515 for altering the surface potential of the sample 508 in the load lock chamber 502. The plasma flood gun 504 may include a plasma chamber 516, a gas input port 517 that regulates the flow rate of a process gas, and an energy source (not shown). The energy source may couple the energy into the plasma chamber 516, and supply a DC or AC current and voltage and electromagnetic waves with frequency from KHz to GHz. Similar to the plasma flood gun 204 of FIG. 2, the plasma flood gun 504 may include various plasma sources as mentioned above. The plasma flood gun 504 may inject the downstream plasma 515 to the load lock chamber 502 through an opening and a conduit 518 connected to the opening. That is, the plasma flood gun 504 and the load lock chamber 502 may be connected by the opening and the conduit 518. The conduit 518 may be installed on the load lock chamber 502 and supported by a flange (not shown) mounted on an outer wall of the load lock chamber 502.

Optionally, the plasma chamber 516 may be connected to the load lock chamber 502 with an opening but without a conduit (e.g., the conduit 518). In some embodiments, the plasma chamber 516 may be installed inside the load lock chamber 502. Optionally, multiple openings (not shown) and/or multiple conduits (not shown) may be configured to connect the plasma chamber 516 with the load lock chamber 502. The size and quantity of the apertures and conduits may be arranged to create certain pressure difference between the plasma chamber 516 and the load lock chamber 502. For example, the pressure in the plasma chamber 516 may be higher or much higher than that in the downstream load lock chamber 502.

Under certain operating conditions, the plasma may leak out of the plasma chamber 516 and diffuse into the load lock chamber 502. The plasma generated in the plasma chamber 516 may absorb the energy from the energy source, transfer the energy into the load lock chamber 502, and sustain the downstream plasma 515.

In some embodiments, the plasma flood gun 504 may be integrated with the load lock chamber 502. As shown in FIG. 5, the whole top surface of the sample 508 may be immersed in the downstream plasma 515. Since the plasma contains positively charged ions and electrons, it may alter the surface potential of the sample 508, for example, when a bias voltage is applied to the bottom of the sample 508 or the back side of the sample 508 via a wiring arrangement installed at the load lock chamber 502.

Referring to FIG. 5, when the gate valve 511 is closed, the load lock chamber 502 may be isolated from the main chamber 501, and the plasma flooding operation in the load lock chamber 502 may have no impact on the vacuum level in the main chamber 501. As such, the charged particle imaging system 500 may carry out plasma flooding on the sample 508 in the load lock chamber 502 and perform charged particle imaging on the sample 513 in the main chamber 501 at the same time. Hence the efficiency and throughput of an image process may be improved.

After a sample goes through a charged particle imaging process in the main chamber 501, the surface of the sample may accumulate positive or negative surface charge. It may have an adverse impact on the subsequent processes and cause quality and yield issues. The plasma immersion flooding methods illustrated above may also be used to neutralize surface charge on a sample and certain charge inside a sample after a charged particle imaging process. A charge neutralization step may be carried out in any chamber where a plasma flood gun (e.g., the aforementioned plasma flood gun 204 or 504) is installed. For the charge embedded deep inside an insulating layer of a sample, UV light may be used to illuminate the sample or the top insulating layer to increase the electric conductivity of the sample. With UV light illumination, the embedded charge may be neutralized at a faster speed.

Figure 6:
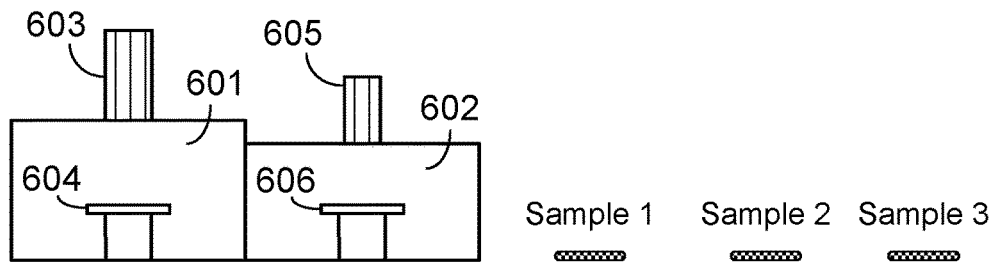
FIG. 6 shows schematic diagrams illustrating a charged particle imaging system with a plasma flood gun producing downstream plasma, according to embodiments of the present invention.
Figure 6:
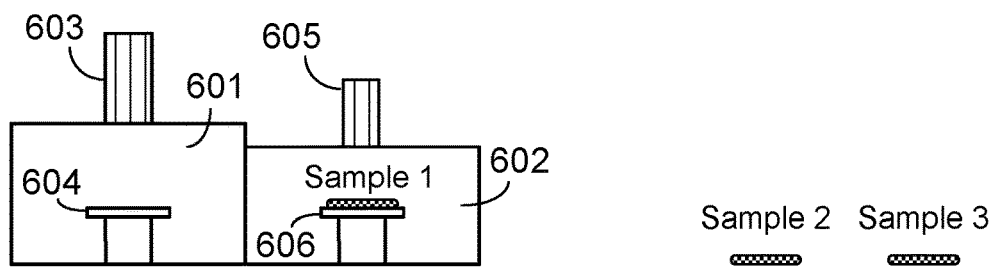
Figure 6:
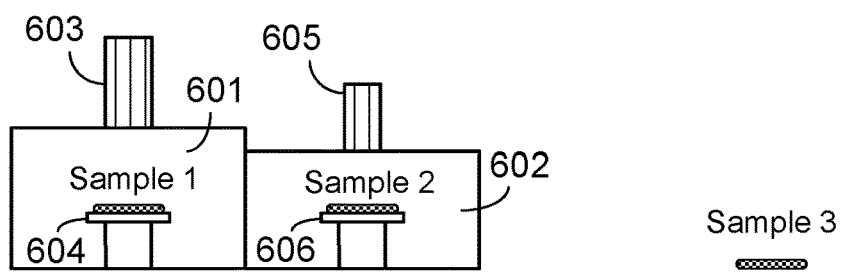
Figure 6:
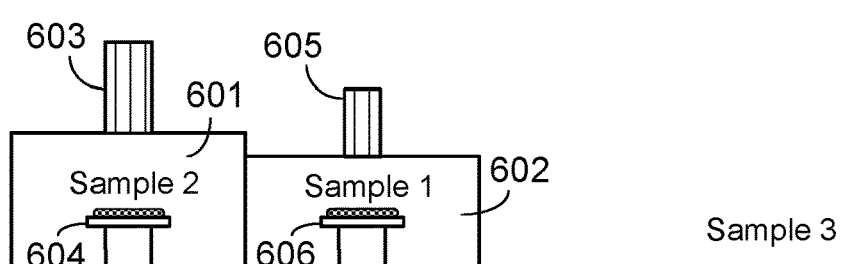
Figure 6:
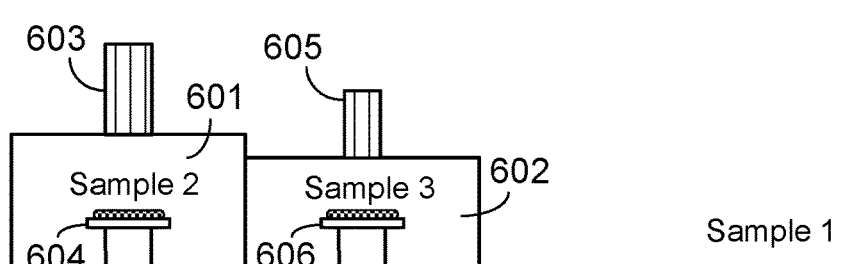

FIG. 6 shows schematic diagrams illustrating the use of a plasma flood gun in a charged particle imaging process according to embodiments of the present invention. At step 1, samples 1-3 are prepared for imaging. A charged particle image system may include a main chamber 601 and a load lock chamber 602. The main chamber 601 may include a charged particle column 603 and a sample stage 604. The load lock chamber 602 may include a plasma flood gun 605 and a sample stage 606. The main chamber 601 and load lock chamber 602 may further include devices and parts similar to those installed at the chambers 501 and 502 of FIG. 5. At step 2, sample 1 is loaded onto the stage 606 of the load lock chamber 602. The pressure in the load lock chamber 602 is pumped down after loading sample 1. The plasma flood gun 605 is ignited and the plasma diffuses into the load lock chamber 602. The top surface of sample 1 is immersed in the plasma. Further, a bias voltage is applied to the bottom of sample 1 and the charge on the top surface of sample 1 becomes saturated. Then, the plasma flood gun 605 is switched off. After the plasma disappears, the bias voltage applied on sample 1 is reduced to zero.

At step 3, sample 1 is transferred to the stage 604 in the main chamber 601, and then sample 2 is loaded onto the stage 606 in the load lock chamber 602. After sample 1 is moved to a location under the charged particle column 603, a charged particle imaging process may begin. In the load lock chamber 602, the plasma diffuses into the load lock chamber 602 to immerse the top surface of sample 2 after the plasma flood gun 605 is turned on. A bias voltage is then applied to the bottom of sample 2 and the charge on the top surface of sample 2 becomes saturated. Then, the plasma flood gun is turned off, the downstream plasma extinguishes, and the bias voltage on sample 2 is reduced to zero.

At step 4, sample 1 is moved to the load lock chamber 602 and sample 2 is moved to the main chamber 601. In the main chamber 601, a charged particle imaging process may begin to image sample 2. In the load lock chamber 602, the plasma flood gun 605 is turned on, and the plasma diffuses into the load lock chamber 602 to form downstream plasma that immerses the top surface of sample 1. Zero bias or a low bias voltage close to zero may be applied to the bottom of sample 1. The zero bias or the low bias voltage close to zero applied on sample 1 may be maintained for a time such that the surface charge of sample 1 is neutralized. Then, the plasma flood gun is turned off and the downstream plasma extinguishes in the load lock chamber 602. If a low bias voltage is applied on sample 1, the bias voltage is reduced to zero after the plasma extinguishes. Further, at step 5, sample 1 is unloaded from the load lock chamber 602 to the atmospheric environment, and sample 3 is placed on the stage 606. After getting pre-charged by plasma flooding, sample 3 is ready for imaging and will be transferred to the main chamber 601 after the imaging process on sample 2 is completed.

In some embodiments, before an imaging and/or lithography process, the top surface of a sample may be charged to a desired potential level. In some embodiments, after an imaging and/or lithography process, the top surface of a sample may be neutralized. In some other embodiments, after an imaging and/or lithography process, the neutralization step on a sample may not be required and thus may not be performed. Because the plasma immersion flooding is relatively fast, the pre-charging process and the neutralization process may take less time than the imaging process. Thus, while a sample is being imaged, some required pre-charging and/or neutralization process may be performed and completed. Hence, the overall system throughput may be optimized.

Figure 7:
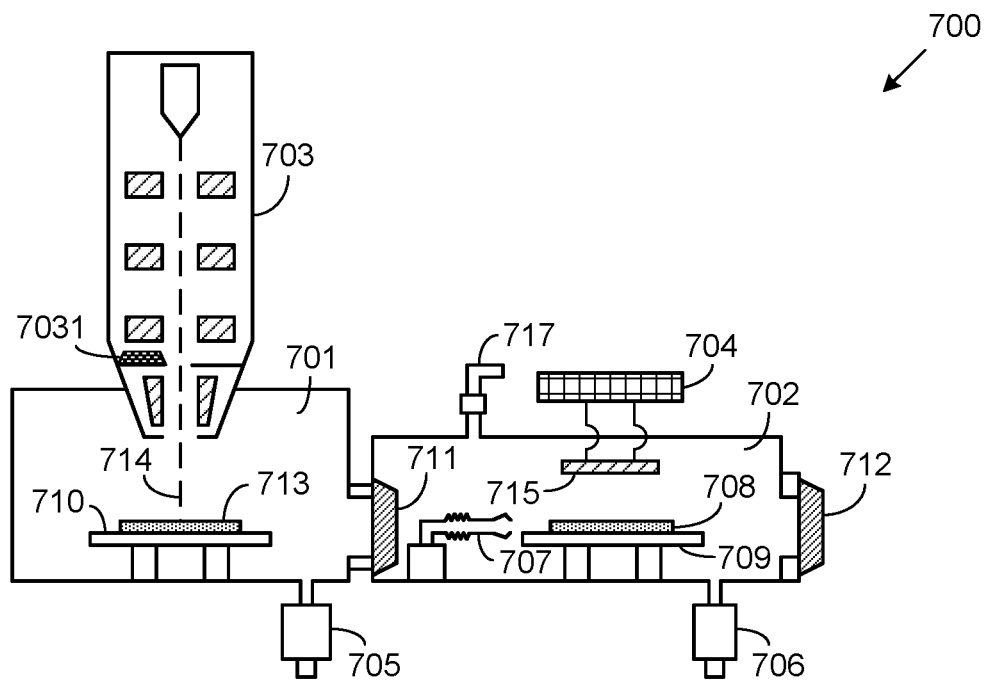
FIG. 7 illustrates a schematic view of a charged particle imaging system with a plasma source, according to embodiments of the present invention.

FIG. 7 schematically illustrates a charged particle imaging system 700 according to embodiments of the present invention. Similar to the systems 200 and 500 illustrated above, the charged particle imaging system 700 may also be used for lithography and thus may be a lithography system as well. The system 700 may include a main chamber 701 and a separate load lock chamber 702. A charged particle column 703 may be connected to the main chamber 701 for imaging a sample. The load lock chamber 702 may have a plasma source with a plasma generation mechanism and a plasma generation structure for surface potential control of a sample. As such, the plasma may be directly generated in the load lock chamber 702, instead of being generated at an external plasma chamber. Similar to the load lock chamber 502 of FIG. 5, the load lock chamber 702 is arranged for fast sample exchange without breaking the vacuum level in the main chamber 701. Further, the charged particle column 703 may include a gun gate valve 7031. When the gun gate valve 7031 is closed, the vacuum state of the charged particle column 703 is not affected by conditions in the main chamber 701. In some embodiments, the plasma generation structure may be installed in the main chamber 701, instead of the load lock chamber 702. In such a case, the load lock chamber 702 may be removed from the charged particle imaging system 700. Optionally, when the plasma generation structure is installed in the main chamber 701, the charged particle imaging system 700 may still include the load lock chamber 702.

The main chamber 701 may be pumped by a vacuum pump system 705. The load lock chamber 702 may be pumped by a vacuum pump system 706. The load lock chamber 702 may have a robotic arm 707 that may load a sample 708 onto a stage 709 and transfer the sample 708 between the stage 709 and a stage 710 in the main chamber 701. A gate valve 711 may be installed to connect the main chamber 701 and the load lock chamber 702. When the gate valve 711 is open, the main chamber 701 and the load lock chamber 702 are at the same pressure. When the gate valve 711 is closed, the main chamber 701 and the load lock chamber 702 are separated. As the pressure in the load lock chamber 702 may not be low enough, when the gate valve 711 is open, the gun gate valve 7031 may be closed to protect the charged particle source of the charged particle column 703. The load lock chamber 702 may have a gate valve 712 that connects it to and isolates it from the external atmospheric environment.

As shown in FIG. 7, the charged particle column 703 may generate a charged particle beam 714 for imaging a sample 713 in the main chamber 701. In the load lock chamber 702, the plasma generation structure may include an electrode 715 that is connected to an external energy source 704. A gas flow controller (not shown) may control a gas input port 717 that regulates the flow rate of a process gas into the chamber 702. The external energy source 704 may transfer the energy to the electrode 715, and create the plasma directly inside the chamber 702. Further, the whole top surface of the sample 708 may be immersed in the plasma, which enables a one-shot pre-charging or neutralization process on the sample 708. As mentioned above, the plasma may also be generated directly inside the main chamber 701 or inside any chamber attached to the main chamber 701. The principles of plasma creation in the load lock chamber 702 are similar to that of the plasma flood gun 204 or 504 illustrated above. The way to carry out immersion plasma flooding is similar to that depicted above when the charged particle imaging systems 200 and 500 are introduced.

Figure 8:
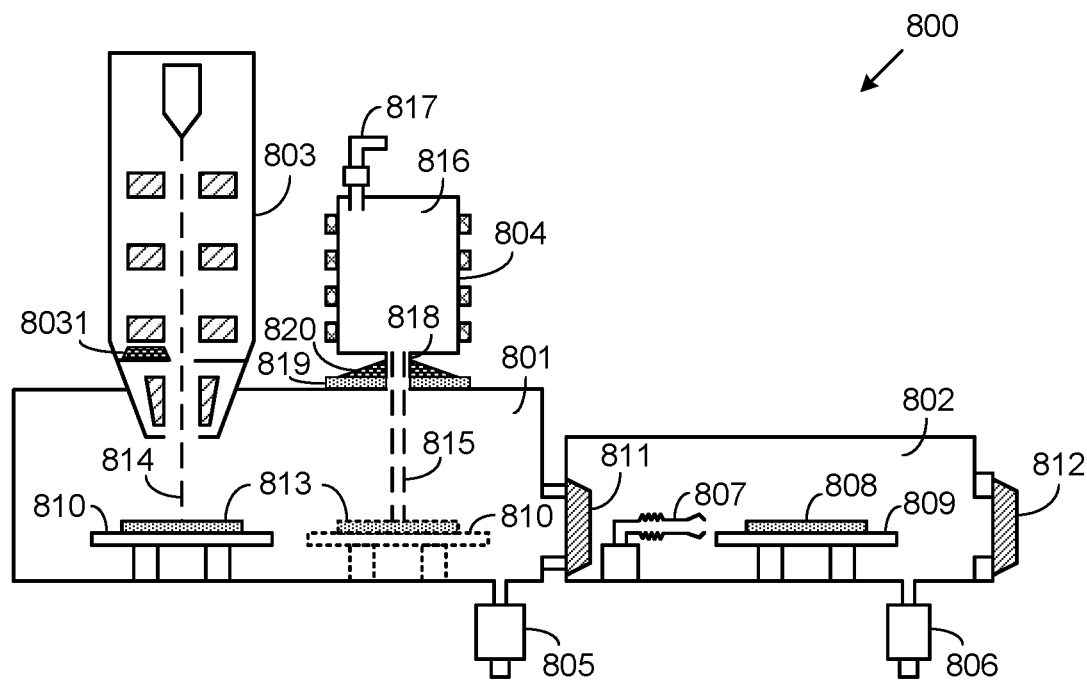
FIG. 8 illustrates a schematic view of a charged particle imaging system with a plasma flood gun producing a flood beam, according to embodiments of the present invention.

FIG. 8 schematically illustrates a charged particle imaging system 800 according to embodiments of the present invention. Similar to the systems 200, 500, and 700 illustrated above, the charged particle imaging system 800 may also be used for lithography and thus may be a lithography system as well. The system 800 may include a main chamber 801 and a separate load lock chamber 802. A charged particle column 803 may be connected to the main chamber 801 for imaging a sample. A plasma flood gun 804 may be connected to the main chamber 801 for surface potential control of the sample. Similar to the load lock chamber 202 of FIG. 2, the load lock chamber 802 is arranged for fast sample exchange without breaking the vacuum level in the main chamber 801. Further, the charged particle column 803 may include a gun gate valve 8031 for isolating a charged particle source of the charged particle column 803 from the main chamber 801. When the gun gate valve 8031 is closed, the vacuum state of the charged particle column 803 is not affected by conditions in the main chamber 801. The gun gate valve 8031 also prevents potential contamination from happening in the charged particle column 803 when the main chamber 801 is not vacuum, e.g., containing the air or certain gases. In some embodiments, additional plasma flood guns may be installed on the main chamber 801 and/or the load lock chamber 802 to increase the speed of a charged particle flooding process. Optionally, the charged particle imaging system 800 may include the main chamber 801 but not include the load lock chamber 802.

The main chamber 801 may be pumped by a vacuum pump system 805. The load lock chamber 802 may be pumped by a vacuum pump system 806. The load lock chamber 802 may have an electro-mechanical robotic arm 807 for transferring a sample. For example, the robotic arm 807 may hold a sample 808 and transfer the sample 808 between a stage 809 in the load lock chamber 802 and a stage 810 in the main chamber 801. A gate valve 811 may be installed between the main chamber 801 and the load lock chamber 802. When the gate valve 811 is open, the main chamber 801 and the load lock chamber 802 are at the same pressure. When the gate valve 811 is closed, the main chamber 801 and the load lock chamber 802 are separated and may have different conditions. The load lock chamber 802 may have a gate valve 812 that connects it to and isolates it from the external atmospheric environment.

As shown in FIG. 8, the charged particle column 803 may generate a charged particle beam 814 for imaging a sample 813 in an imaging time period, and the plasma flood gun 804 may produce a flood beam 815 for altering the surface potential of the sample 813 in a processing time period. The imaging time period and processing time period do not overlap to protect the charged particle column 803. The plasma flood gun 804 may include a plasma chamber 816, a gas input port 817 that regulates the flow rate of a process gas, an energy source (not shown), and a bias voltage supply (not shown). The energy source may couple the energy into the plasma chamber 816, and supply a DC or AC current and voltage and electromagnetic waves with frequency from KHz to GHz. The plasma flood gun 804 may include different plasma sources as described above. The plasma source, i.e., the plasma flood gun 804, may be biased to a positive or negative potential. For example a bias voltage may be applied to the plasma source using the bias voltage supply. The plasma flood gun 804 may be electrically isolated from the main chamber 801 by an insulating layer 819. When the bias voltage on the plasma source is negative, the plasma flood gun 804 may produce an electron flood beam. When the bias voltage on the plasma source is positive, the plasma flood gun 804 may produce an ion flood beam containing positively charged ions. That is, either electrons or positively charged ions may be extracted from the plasma flood gun 804 to form the charged particle flood beam 815. The flood beam 815 may be directed to the sample 813 in the main chamber 801. Before entering the main chamber 801 and impinging onto the sample 813, the flood beam 815 may pass through an opening that is connected with a conduit 818. In some cases, the opening may be a circle, a square, a rectangle, or a long slit. Optionally, multiple openings may be configured between the plasma chamber 816 and the main chamber 801. In some cases, the openings may be circles, squares, rectangles, or long slits. The conduit 818 may be mounted on the insulating layer 819 and supported by a flange 820.

In some embodiments as shown in FIG. 8, the plasma flood gun 804 may be integrated with the main chamber 801. The plasma flood gun 804 may be connected with the main chamber 801 via the opening or the conduit 818. Optionally, the plasma flood gun 804 may also be integrated with the load lock chamber 802. The stage 810 may move the sample 813 from a location under the charged particle column 803 to a location under the plasma flood gun 816, as shown in dotted lines in FIG. 8. Since the plasma volume may be much larger than a filament in the traditional thermionic flood gun, a large electron beam or ion beam may be created by configuring the shape and size of the opening and the conduit 818. For example, the width of the opening may be larger than 100 mm. When the sample 813 is a 300 mm silicon wafer, the flood beam 815 may scan over the sample and it may take three scans to cover the silicon wafer. In some embodiments, the sample 813 may be scanned at a predetermined speed such that a designated area on the sample 813 is charged to a predetermined surface potential or existing charge on the sample is neutralized. In some cases, the sample 813 may remain stationary, while the flood beam 815 is moved relative to the sample 813 to irradiate the surface of the sample 813. Alternatively, the flood beam 815 may remain stationary relative to the main chamber 801, while the sample 813 may be traversed to facilitate the scanning process. Further, the sample 813 may be biased to a certain potential by a bias voltage. The bias voltage may be applied to the sample 813 or the stage 810 to adjust the surface potential of the top surface of the sample 813. The bias voltage applied to the sample 813 or the stage 810 may be maintained before the flood beam 815 is turned off. Hence, the plasma flood gun 804 may replace a traditional thermionic flood gun, and provide either an ion beam or electron beam. The size of the electron or ion beam may be much larger than that of an electron beam provided by a traditional thermionic flood gun.

In some embodiments, the conduit 818 may be tilted at an angle (not shown) such that the paths of the flood beam 815 and the charged particle beam 814 overlap at a position under the charged particle column 803. For example, the flood beam 815 may impinge on a first spot of the surface of the sample 813, while the charged particle beam 814 may impinge on a second spot of the surface. When the first spot and second spot overlap, the pre-charging process and imaging process may be performed subsequently while the sample 813 remains at the same location.

Different kinds of process gases may be used to create the plasma for surface charge control or surface potential control. For example, helium, neon, argon, krypton, xenon, nitrogen, oxygen, or even hydrogen may be used to generate the plasma. Plasma generated by noble gases, such as helium, neon, argon, krypton, or xenon do not create reactive species that may chemically react with certain samples. In some embodiments, reactive oxygen, hydrogen, or a mixture containing oxygen or hydrogen may be used to generate the plasma. Reactive oxygen and hydrogen radicals may also be used to remove certain contaminants, such as hydrocarbon, inside a chamber (e.g., the main chamber 801 of FIG. 8), or on a sample inside a chamber. Optionally, plasma used for removing contaminants in a chamber may be generated using one or more process gases such as oxygen, hydrogen, fluorine, and nitrogen. Further, a switch may be configured such that the process gas at a plasma source (e.g., a plasma flood gun) may be switched conveniently between a noble gas and one or more of the oxygen, hydrogen, fluorine, and nitrogen process gas. In such cases, the plasma source may be used as a flood gun and decontaminator at the same time for a charged particle imaging or lithography equipment.

Although the embodiments of the present invention as described above are implemented at a charged particle imaging apparatus such as an electron beam inspection and review equipment, or a CD-SEM system, it should not be considered that the embodiments are only limited to such an apparatus. Further, the same methods as or similar methods to those illustrated above may also apply to other systems and apparatus that use charged particles for imaging, probing, processing, lithography, or ion implantation, such as an analytical secondary electron microscope (SEM), focused ion beam equipment (FIB), an electron beam and ion beam lithography system, an X-ray photoelectron spectrometer (XPS), an Auger electron spectrometer, a secondary ion mass spectrometer (SIMS), an ion implanter, etc. For example, the charged particle imaging systems 200, 500, 700, and 800 may work as a charged particle lithography system or inspection system, when the charged particle columns 203, 503, 703, and 803 are replaced by an electron beam column, respectively. Similarly, when the charged particle columns 203, 503, 703, and 803 are replaced by an ion implantation tool, the charged particle imaging systems 200, 500, 700, and 800 may be converted into an ion implantation system, i.e., a charged particle processing system that processes a sample.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments. Furthermore, it is intended that the appended claims cover any and all such applications, modifications, and embodiments within the scope of the present invention.

I claim:

1. A method for altering surface charge on an insulating surface of a sample, comprising:
    placing one or more first samples having insulating surface areas inside a first vacuum chamber, wherein the first vacuum chamber is connected to one or more external plasma sources through one or more first openings;
    generating first plasma inside the one or more external plasma sources;
    causing the first plasma generated inside the one or more external plasma sources to diffuse into the first vacuum chamber to generate second downstream plasma;
    positioning the one or more first samples to a location such that the one or more first samples are immersed in the second downstream plasma;
    applying a first bias voltage to conductive layers of the one or more first samples, or applying a first bias voltage to a holder that holds the one or more first samples;
    after the second downstream plasma is generated and the first bias voltage is applied, waiting for a predetermined amount of time such that surface potential of the insulating surface areas of the one or more first samples reaches a predetermined value;
    turning off the first plasma and waiting for the second downstream plasma to disappear; and
    after the second downstream plasma is extinguished, changing the first bias voltage or reducing the first bias voltage to zero.

2. The method of claim 1, wherein the first vacuum chamber is a main process vacuum chamber connected to one or more charged particle columns, the first vacuum chamber is a load lock chamber that facilitates sample exchange between an atmospheric environment and a main process vacuum chamber connected to one or more charged particle columns, or the first vacuum chamber is a chamber that is attached to a main process vacuum chamber connected to one or more charged particle columns, and when the first vacuum chamber is the load lock chamber, a plasma flooding surface charge control process is carried out on the one or more first samples inside the load lock chamber while a second sample is being imaged or processed by the one or more charged particle columns in the main process vacuum chamber.

3. The method of claim 1 further including charging the insulating surface areas of the one or more first samples positively or negatively for creating the surface potential of the predetermined value with respect to the conductive layers of the one or more first samples, or modifying or neutralizing surface charge in the insulating surface areas or inside the one or more first samples.

4. The method of claim 1, wherein surface charge or the surface potential of the one or more first samples is adjusted for improving image focus stability, improving image distortion, improving a beam position drift, improving image voltage contrast, improving a signal to noise ratio, and/or neutralizing charge accumulated in the insulating surface areas or inside the one or more first samples.

5. The method of claim 1, wherein the first plasma is created by coupling a dc or ac current, a dc or ac voltage, or an electromagnetic wave with frequency from KHz to GHz, from one or more external energy sources into the one or more external plasma sources attached to the first vacuum chamber, and a coupling method includes an inductively coupling method, a capacitively coupling method, a dc glow discharge coupling method, a microwave discharge coupling method, or an electron cyclotron resonance (ECR) discharge coupling method.

6. The method of claim 1, wherein the first plasma is generated with one or more noble gases to reduce a chance of chemical reaction with the one or more first samples.

7. The method of claim 1, wherein the one or more first openings are one or more differential pumping apertures arranged between the one or more external plasma sources and the first vacuum chamber for reducing a size of the one or more first openings, making pressure inside the one or more external plasma sources higher than pressure inside the first vacuum chamber, improving plasma discharge efficiency, and/or making a plasma ignition process reliable.

8. The method of claim 1, wherein the first bias voltage is ramped at a predetermined speed for minimizing sudden inrush of high energy electrons or ions onto the first samples.

9. The method of claim 1, wherein the second downstream plasma is extinguished first after the surface potential of the first sample reaches the predetermined value and the first bias voltage is maintained before the second downstream plasma is extinguished.

10. The method of claim 1, wherein the first bias voltage is zero voltage or a voltage close to zero when existing charge of the one or more first sample is neutralized.

11. The method of claim 1, wherein the one or more first samples are irradiated by ultraviolet light for increasing conductivity inside the one or more first samples such that embedded charge inside the one or more first samples is neutralized by electrons and ions from the second downstream plasma.

12. A method of altering surface charge on an insulating surface, comprising:
placing one or more first samples that have insulating surface areas inside a first vacuum chamber;
generating first plasma inside the first vacuum chamber where the one or more first samples are placed;
positioning the one or more first samples to a location such that the one or more first samples are immersed in the first plasma;
applying a first bias voltage to conductive layers of the one or more first samples, or applying a first bias voltage to a holder that holds the one or more first samples;
after the first plasma is generated and the first bias voltage is applied, waiting for a predetermined amount of time such that a surface potential in the insulating surface areas of the one or more first samples reaches a predetermined value;
turning off the first plasma; and
after the first plasma disappears, changing the first bias voltage or reducing the first bias voltage to zero.

13. The method of claim 12, wherein the first vacuum chamber is a main process vacuum chamber connected to one or more charged particle columns, the first vacuum chamber is a load lock chamber that facilitates sample exchange between an atmospheric environment and a main process vacuum chamber connected to one or more charged particle columns, or the first vacuum chamber is a chamber that is attached to a main process vacuum chamber connected to one or more charged particle columns, and when the first vacuum chamber is the load lock chamber, a plasma flooding surface charge control process is carried out on the one or more first samples inside the load lock chamber while a second sample is being imaged or processed by the one or more charged particle columns in the main process vacuum chamber.

14. The method of claim 12, wherein the insulating surface areas of the one or more first samples are charged positively or negatively for creating the surface potential of the predetermined value with respect to conductive layers of the one or more first samples, or modifying or neutralizing existing surface charge in the insulating surface areas or inside the one or more first samples.

15. The method of claim 12, wherein surface charge or the surface potential of the one or more first samples is adjusted for improving image focus stability, improving image distortion, improving beam position drift, improving image voltage contrast, improving signal to noise ratio, and/or neutralizing charge accumulated in the insulating surface areas or inside the one or more first samples.

16. The method of claim 12, wherein the first plasma is created by coupling a dc or ac current, a dc or ac voltage, or an electromagnetic wave with frequency from KHz to GHz, from one or more external energy sources into the first vacuum chamber, and a coupling method includes an inductively coupling method, a capacitively coupling method, a dc glow discharge method, a microwave discharge method, or an electron cyclotron resonance (ECR) discharge method.

17. The method of claim 12, wherein the first plasma is generated with one or more noble gases for reducing a chance of chemical reaction with the one or more first samples.

18. The method of claim 12, wherein the first bias voltage is ramped at a predetermined speed for minimizing a sudden inrush of high energy electrons or ions onto the one or more first samples.

19. The method of claim 12, wherein the first plasma is extinguished first after the surface potential of the one or more first samples reaches the predetermined value and the first bias voltage is maintained before the first plasma is extinguished.

20. The method of claim 12, wherein the first bias voltage is zero voltage or a voltage close to zero when existing charge of the first sample are neutralized.

21. The method of claim 12, wherein the one or more first samples are irradiated by ultraviolet light for increasing conductivity inside the one or more first samples and neutralizing embedded charge inside the one or more first samples by electrons and ions from the first plasma.

22. A method of altering surface charge on an insulating surface, comprising:
placing one or more first samples that have one or more insulating surface areas inside a first vacuum chamber, wherein the first vacuum chamber is connected to one or more external plasma sources through one or more first openings, and the first vacuum chamber and the one or more external plasma sources are electrically insulated by an insulator configured between the first vacuum chamber and the one or more external plasma sources;

generating first plasma inside the one or more external plasma sources;

applying a first bias voltage to the one or more external plasma sources to extract a first charged particle beam from the one or more external plasma sources through the one or more first openings;

positioning the one or more first samples to a location such that a portion of the one or more insulating surface areas of the one or more first samples is illuminated by the first charged particle beam;

applying a second bias voltage to conductive layers of the one or more first samples, or applying a second bias voltage to a holder that holds the one or more first samples;

scanning the one or more first samples in an X-Y plane such that all portions of the one or more insulating surface areas of the one or more first samples are illuminated by the first charged particle beam;

turning off the first plasma;

turning off the first bias voltage; and changing the second bias voltage to zero or a value different from the second bias voltage after the first charged particle beam is turned off.

23. The method of claim 22, wherein the first vacuum chamber is a main process vacuum chamber connected to one or more charged particle columns, the first vacuum chamber is a load lock chamber that facilitates sample exchange between an atmospheric environment and a main process vacuum chamber connected to one or more charged particle columns, or the first vacuum chamber is a chamber that is attached to a main process vacuum chamber connected to one or more charged particle columns, and when the first vacuum chamber is the load lock chamber, a plasma flooding surface charge control process is carried out on the one or more first samples inside the load lock chamber while a second sample is being imaged or processed by the one or more charged particle columns in the main process vacuum chamber.

24. The method of claim 22, wherein the one or more insulating surface areas of the one or more first samples are charged positively or negatively for creating a predetermined surface potential with respect to conductive layers of the one or more first samples, or modifying or neutralizing existing surface charge of the one or more insulating surface areas or inside the one or more first samples.

25. The method of claim 22, wherein surface charge or a surface potential of the one or more first samples is adjusted for improving better image focus stability, improving image distortion, improving beam position drift, improving image voltage contrast, improving signal to noise ratio, and/or neutralizing charge accumulated in the insulating surface areas or inside the one or more first samples.

26. The method of claim 22, wherein the first plasma is generated by coupling a dc or ac current, a dc or ac voltage, or an electromagnetic wave with frequency from KHz to GHz, from one or more than one external energy sources into the one or more external plasma sources attached to the first vacuum chamber and a coupling method includes an inductively coupling method, a capacitively coupling method, a dc glow discharge method, microwave discharge method, or an electron cyclotron resonance (ECR) discharge method.

27. The method of claim 22, wherein the first plasma is generated with one or more noble gases for reducing a chance of chemical reaction with the one or more first samples.

28. The method of claim 22, wherein the one or more first openings between the one or more external plasma sources and the first vacuum chamber are one or more circles, squares, rectangles, or long slits.

29. The method of claim 22, wherein the first charged particle beam is an ion beam when the first bias voltage is positive and the first charged particle beam is an electron beam when the first bias voltage is negative.

30. The method of claim 22, wherein one of the one or more first samples is scanned at a predetermined speed such that a designated area on the one of the one or more first samples is charged to a predetermined surface potential or existing charge on the one of the one or more first samples is neutralized.

31. The method of claim 22, wherein the first plasma and the first charged particle beam are turned off first after surface charge of the one or more first samples reaches a predetermined value and the second bias voltage is maintained before the first charged particle beam is turned off.

32. The method of claim 22, wherein the first bias voltage and the second bias voltage are zero voltage or a voltage close to zero when existing charge of the one or more first samples is neutralized.

33. The method of claim 22, wherein the one or more first samples are irradiated by ultraviolet light for increasing conductivity inside the one or more first samples such that embedded charge inside the one or more first samples is neutralized by the first charged particle beam.

34. A method of altering surface charge of a sample and removing contaminations in a vacuum chamber of a charged particle system, comprising:

using one or more plasma sources attached to the vacuum chamber for altering surface charge of the sample; and using the one or more plasma sources for removing contaminations in the vacuum chamber, wherein altering surface charge of the sample comprises:

placing the sample inside the vacuum chamber, wherein the vacuum chamber is connected to the one or more plasma sources through one or more first openings;

generating first plasma inside the one or more plasma sources;

causing the first plasma generated inside the one or more plasma sources to diffuse into the vacuum chamber to generate second downstream plasma;

positioning the sample to a location such that the sample is immersed in the second downstream plasma;

applying a first bias voltage to a conductive layer of the sample, or applying a first bias voltage to a metal holderthat holds the sample;

after the second downstream plasma is generated and the first bias voltage is applied, waiting for a predetermined amount of time such that surface potential of an insulating surface layer of the sample reaches a predetermined value;

turning off the first plasma and waitingfor the second downstream plasma to disappear; and after the second downstream plasma is extinguished, changing the first bias voltage or reducing the first bias voltage to zero.

35. The method of claim 34, wherein the one or more plasma sources generate the first plasma with a gas including oxygen, hydrogen, fluorine, or nitrogen or a mixture of gases including one or more gases of oxygen, hydrogen, fluorine, and nitrogen.

36. The method of claim 34, wherein a process gas is switched between one or more noble gases and a gas including oxygen, hydrogen, fluorine, and/or nitrogen.

\* \* \* \* \*